US008183070B2

(12) United States Patent
Kim et al.

(10) Patent No.: US 8,183,070 B2
(45) Date of Patent: May 22, 2012

(54) ARRAY SUBSTRATE FOR LIQUID CRYSTAL DISPLAY DEVICE AND METHOD OF FABRICATING THE SAME

(75) Inventors: Seok-Won Kim, Paju-si (KR); Won-Joon Ho, Cheongju-si (KR); Hyuk-Jin Kwon, Seongnam-si (KR); Chang-Mo Yoo, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 638 days.

(21) Appl. No.: 12/271,775

(22) Filed: Nov. 14, 2008

(65) Prior Publication Data
US 2009/0294781 A1 Dec. 3, 2009

(30) Foreign Application Priority Data
Jun. 2, 2008 (KR) .................. 10-2008-0051643

(51) Int. Cl.
*H01L 33/00* (2010.01)
(52) U.S. Cl. ............ 438/30; 438/149; 438/798; 257/88; 257/E21.412; 257/E33.053
(58) Field of Classification Search .............. 438/30, 438/142, 149, 151, 197, 798; 257/213, 88, 257/E21.412, E33.053
See application file for complete search history.

(56) References Cited

U.S. PATENT DOCUMENTS
2008/0135857 A1* 6/2008 Kim et al. ............... 257/88
2008/0227243 A1* 9/2008 Yang et al. ............... 438/159
* cited by examiner

*Primary Examiner* — Ha Tran T Nguyen
*Assistant Examiner* — Suberr Chi
(74) *Attorney, Agent, or Firm* — Birch, Stewart, Kolasch & Birch, LLP

(57) ABSTRACT

A method of fabricating an array substrate for a liquid crystal display device includes: forming an initial photoresist (PR) pattern on a metallic material layer; etching the metallic material layer using the initial PR pattern as an etching mask to form the data line and a metallic material pattern, wherein the initial PR pattern is disposed on the data line; performing a first ashing process onto the initial PR pattern to partially remove the initial PR pattern so as to form a first ashed PR pattern, the first ashed PR pattern having a smaller width and a smaller thickness than the initial PR pattern such that end portions of the data line are exposed by the first ashed PR pattern; etching the intrinsic amorphous silicon layer and the impurity-doped amorphous silicon layer by a first dry-etching process; forming a source electrode and a drain electrode on the substrate.

18 Claims, 13 Drawing Sheets

US 8,183,070 B2

ARRAY SUBSTRATE FOR LIQUID CRYSTAL DISPLAY DEVICE AND METHOD OF FABRICATING THE SAME

The present application claims the benefit of Korean Patent Application No. 10-2008-0051643 filed in Korea on Jun. 2, 2008, which is hereby incorporated by reference.

BACKGROUND OF THE INVENTION

1. Field of the Invention

The present invention relates to a liquid crystal display (LCD) device and more particularly to an array substrate having an improved aperture ratio and brightness and a method of fabricating the array substrate.

2. Discussion of the Related Art

Since a liquid crystal display (LCD) device has characteristics of light weight, thinness and low power consumption, LCD devices have been widely used, particularly in televisions, computer monitors, cellular phone displays, personal digital assistants (PDAs) and etc. Among the known types of LCD devices, active matrix LCD (AM-LCD) devices, which have thin film transistors (TFTs) arranged in a matrix form, are the subject of significant research and development because of their high resolution and superior ability in displaying moving images.

Generally, the LCD device is manufactured through an array substrate fabricating process, a color filter substrate fabricating process and a cell process. In the array substrate fabricating process, array elements, such as a TFT and a pixel electrode, are formed on a first substrate. In the color filter substrate fabricating process, a color filter and a common electrode are formed on a second substrate. In a cell process, the first and second substrates are attached to each other with a liquid crystal interposed therebetween.

FIG. 1 is an exploded perspective view of a related art LCD device. The LCD device includes first and second substrates 12 and 22, and a liquid crystal layer 30. The first and second substrates 12 and 22 face each other, and the liquid crystal layer 30 is interposed therebetween.

The first substrate 12 includes a gate line 14, a data line 16, a TFT "Tr", and a pixel electrode 18. The first substrate 12 including these elements is referred to as an array substrate 10. The gate line 14 and the data line 16 cross each other such that a region is formed between the gate and data lines 14 and 16 and is defined as a pixel region "P". The TFT "Tr" is formed at a crossing portion between the gate and data lines 14 and 16, and the pixel electrode 18 is formed in the pixel region "P" and connected to the TFT "Tr".

The second substrate 22 includes a black matrix 25, a color filter layer 26, and a common electrode 28. The second substrate 22 including these elements is referred to as a color filter substrate 20. The black matrix 25 has a lattice shape to cover a non-display region of the first substrate 12, such as the gate line 14, the data line 16, the TFT "Tr". The color filter layer 26 includes first, second, and third sub-color filters 26a, 26b, and 26c. Each of the sub-color filters 26a, 26b, and 26c has one of red, green, and blue colors R, G, and B and corresponds to the each pixel region "P". The common electrode 28 is formed on the black matrix 25 and the color filter layers 26 and over an entire surface of the second substrate 22.

Although not shown, to prevent the liquid crystal layer 30 from leaking, a seal pattern may be formed along edges of the first and second substrates 12 and 22. First and second alignment layers may be formed between the first substrate 12 and the liquid crystal layer 30 and between the second substrate 22 and the liquid crystal layer 30. A polarizer may be formed on an outer surface of the first and second substrates 12 and 22.

An LCD device includes a backlight assembly opposing an outer surface of the first substrate 12 to supply light to the liquid crystal layer 30. When a scanning signal is applied to the gate line 14 to control the TFT "Tr", a data signal is applied to the pixel electrode 18 through the data line 16 such that the electric field is induced between the pixel and common electrodes 18 and 28. Then, the electric field causes the liquid crystals to switch on and as a result, the LCD device produces images using the light from the backlight assembly.

FIG. 2 is a cross-sectional view of one pixel region of an array substrate for a related art LCD device. A gate line and a data line 79 are formed on a substrate 59. The gate line and the data line 79 cross each other to define a pixel region P. A gate electrode 63 connected to the gate line is formed at a switching region TrA in the pixel region P. A gate insulating layer 66 is formed on the gate line and the gate electrode 63. A semiconductor layer 76 including an active layer 67 and an ohmic contact layer 74 is formed on the gate insulating layer to correspond to the gate electrode 63. A source electrode 82 and a drain electrode 84 are formed on the ohmic contact layer 74. The source electrode 82 is connected to the data line 79, and the drain electrode 84 is spaced apart from the source electrode 82. The gate electrode 63, the gate insulating layer 66, the semiconductor layer 76, the source electrode 82 and the drain electrode 84 constitute a TFT Tr in the switching region TrA. A passivation layer 86 including a drain contact hole 87 is formed on the data line and the TFT Tr. The drain contact hole 87 exposes a portion of the drain electrode 84. A pixel electrode 88 is formed on the passivation layer 86 in each pixel region P and contacts the drain electrode 84 through the drain contact hole 87.

The semiconductor layer 76 protrudes beyond the source and drain electrodes with a first width "A1" above about 2 micrometers. In addition, a semiconductor pattern 73 including a first pattern 72 and a second pattern 68 protrudes beyond the data line 79 with a second width "A2" above about 2 micrometers at each side. It is because the array substrate 59 is formed by a four mask process. The four mask process is explained with reference to accompanied drawings.

FIGS. 3A to 3H are cross-sectional views showing a four mask process for fabricating an array substrate according to the related art.

In FIG. 3A, a first metallic material layer is formed on the substrate 59. The first metallic material layer is patterned by a first mask process to form the gate line and the gate electrode 63. The gate electrode 63 is disposed in the switching region TrA. Although not shown, the first mask process includes a step of forming a photoresist (PR) layer, a step of exposing the PR layer to light using a first mask, a step of developing the exposed PR layer to form a PR pattern, a step of etching the first metallic material layer using the PR pattern as an etching mask to form the gate line and the gate electrode 63 and a step of stripping the PR pattern.

In FIG. 3B, a gate insulating layer 66, an intrinsic amorphous silicon layer 69, an impurity-doped amorphous silicon layer 70 and a second metallic material layer 78 are sequentially formed on the gate line and the gate electrode 63. A PR layer is formed on the second metallic material layer 78 and patterned using a second mask to form first and second PR patterns 91a and 91b. The second mask may be a refractive exposing mask or a half-tone exposing mask. The first PR pattern 91a has a first thickness and corresponds to the source electrode, the drain electrode and the data line. The second PR pattern 91b has a second thickness smaller than the first thickness and corresponds to a center of the gate electrode 63. Namely, the second PR pattern 91b corresponds to a space between the source and drain electrodes. The PR layer in other portions is completely removed such that the second metallic material layer 78 is exposed.

In FIG. 3C, the exposed second metal material layer 78 (of FIG. 3B) is wet-etched with an etchant using the first and second PR patterns 91a and 91b as an etching mask to form the data line 79 and a metallic material pattern 80. The impurity-doped amorphous silicon layer 70 is exposed between the data line 79 and the metallic material pattern 80. The second metallic material layer 78 (of FIG. 3B) may include a low resistance metallic material. For example, the second metallic material layer 78 (of FIG. 3B) may include one of copper (Cu), Cu alloy, aluminum (Al), Al alloy. When the second metallic material layer 78 (of FIG. 3B) includes Cu or Cu alloy, the second metallic material layer 78 (of FIG. 3B) has a relatively high etching rate for the etchant. Accordingly, the data line 79 and the metallic material pattern 80 have an undercut structure under the first PR pattern 91a. Namely, the data line 79 has a width smaller than the first PR pattern 91a, and a width of the metallic material pattern 80 is smaller than that of the first and second PR patterns 91a and 91b in the switching region TrA.

In FIG. 3D, the exposed impurity-doped amorphous silicon layer 70 (of FIG. 3C) and the intrinsic amorphous silicon layer 69 (of FIG. 3C) are dry-etched using the first and second PR patterns 91a and 91b to form an ohmic contact pattern 71 and an active layer 67 under the metallic material pattern 80. At the same time, a first pattern 72 of impurity-doped amorphous silicon and a second pattern 68 of intrinsic amorphous silicon are formed under the data line 79. The first pattern 72 and the second pattern 68 constitute a semiconductor pattern 73. Since the ohmic contact pattern 71 and the active layer 67 are formed using the first and second PR patterns 91a and 91b as an etching mask, they have a width greater than the metallic material pattern 80.

In FIG. 3E, an ashing process is performed onto the substrate 59. As a result, the second PR pattern 91b is removed such that a portion of the metallic material pattern 80 is exposed. A thickness of the first PR pattern 91a is reduced such that a third PR pattern 92 is formed. The third PR pattern 92 may have the same width as the first PR pattern 91a. In this case, outer ends of the third PR pattern 92 on the metallic material pattern 80 may be overlap ends of the ohmic contact pattern 71, and outer ends of the third PR pattern 92 on the data line 79 may be overlap ends of the first pattern 72. On the other hand, the third PR pattern 92 may have a width smaller than the first PR pattern 91a because of the ashing process. In this case, outer ends of the third PR patterns 92 on the metallic material pattern 80 and the data line 79 are disposed within the ohmic contact pattern 71 and the first pattern 72, respectively.

In FIG. 3F, the portion of the metallic material pattern 80 (of FIG. 3E) exposed by removing the second PR pattern 91b (of FIG. 3E) is wet-etched using an etchant to form the source electrode 82 and the drain electrode 84. As a result, the source electrode 82 and the drain electrode 84 are disposed on the ohmic contact pattern 71 and spaced apart from each other. Since the metallic material pattern 80 (of FIG. 3E) has a relatively high etching rate for the etchant, the source electrode 82, the drain electrode 84 and the data line 79 experience a significant undercut effect with the third PR pattern 92.

In FIG. 3G, the portion of the ohmic contact pattern 71 exposed between the source and drain electrodes 82 and 84 is dry-etched to form an ohmic contact layer 74 under the source and drain electrodes 82 and 84. At the same time, a portion of the active layer 67 is exposed through the ohmic contact layer 74 to define a channel. The gate electrode 63, the gate insulating layer 66, a semiconductor layer 76 including the active layer 67 and the ohmic contact layer 74, the source electrode 82 and the drain electrode 84 constitute the TFT Tr in the switching region TrA.

In FIG. 3H, the third PR pattern 92 (of FIG. 3G) is stripped. Then, the passivation layer 86 including the drain contact hole 87 is formed on the data line 79 and the TFT Tr by a third mask process. The drain contact hole 87 exposes a portion of the drain electrode 84. The pixel electrode 88 contacting the drain electrode 84 through the drain contact hole 87 is formed on the passivation layer 86 by a fourth mask process. The array substrate is fabricated by the above four mask processes.

As mentioned above, in the related array substrate, the semiconductor pattern 73 including the first pattern 72 and the second pattern 68 under the data line 79 protrudes beyond the data line 79 with a range above about 2 micrometers at each side. Since the pixel electrode 88 is disposed to be spaced apart with a predetermined distance from the semiconductor pattern 73, aperture ratio is reduced due to the distance between the data line 79 and the pixel electrode 88. Therefore, it is desired to reduce the distance between the data line 79 and the pixel electrode 88 in order to improve the aperture ratio.

SUMMARY OF THE INVENTION

Accordingly, the present invention is directed to an array substrate for a liquid crystal display device and a method of fabricating the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating an array substrate for a liquid crystal display device includes forming on a substrate a gate insulating layer, an intrinsic amorphous silicon layer, an impurity-doped amorphous silicon layer, and a metallic material layer; forming an initial photoresist (PR) pattern on the metallic material layer; etching the metallic material layer using the initial PR pattern as an etching mask to form the data line and a metallic material pattern, wherein the initial PR pattern is disposed on the data line; performing a first ashing process onto the initial PR pattern to partially remove the initial PR pattern so as to form a first ashed PR pattern, the first ashed PR pattern having a smaller width and a smaller thickness than the initial PR pattern such that end portions of the data line are exposed by the first ashed PR pattern; etching the intrinsic amorphous silicon layer and the impurity-doped amorphous silicon layer by a first dry-etching process using the data line as an etching mask to form first and second patterns under the data line; etching a portion of the metallic material pattern to form a source electrode and a drain electrode on the substrate; removing the first ashed PR pattern; forming a passivation layer on the source electrode, the drain electrode and the data line; and forming a pixel electrode on the passivation layer.

In another aspect of the present invention, a method of fabricating an array substrate for a liquid crystal display device includes forming a gate line and a gate electrode on a substrate, the gate electrode connected to the gate line; sequentially forming a gate insulating layer, an intrinsic amorphous silicon layer, an impurity-doped amorphous silicon layer, and a metallic material layer on the gate line and the gate electrode; forming first photoresist (PR) patterns and a second PR pattern having a thickness smaller than each of the first PR patterns on the metallic material layer; etching the metallic material layer using the first and second PR patterns as an etching mask to form a data line and a metallic material pattern, the data line crossing the gate line, and the metallic material pattern corresponding to the gate electrode, wherein the second PR pattern and two of the first PR patterns located adjacent to both sides of the second PR pattern are disposed on the metallic material pattern, and one of the first PR patterns is disposed on the data line, and wherein each of the metallic material pattern and the data line has an undercut structure with the first PR patterns; performing a first ashing process onto the first and second PR patterns to partially remove the first PR patterns and to completely remove the second PR pattern, so as to form third PR patterns, each of the third PR patterns having a smaller width and a smaller thickness than each of the first PR patterns such that end portions of the data line and the metallic material patterns and a center portion of the metallic material pattern are exposed by the third PR patterns; etching the intrinsic amorphous silicon layer and the impurity-doped amorphous silicon layer by a first dry-etching process using the metallic material pattern and the data line as an etching mask to form an ohmic contact pattern and an active layer under metallic material pattern, and first and second patterns under the data line, wherein each of the ohmic contact pattern and the active layer has the same area and shape as the metallic material pattern and completely overlaps the metallic material pattern, and each of the first and second patterns has the same area and shape as the data line and completely overlaps data line; etching the center of the metallic material pattern exposed by the third PR patterns to form a source electrode connected to the data line and a drain electrode spaced apart from the source electrode, wherein each of the source electrode, the drain electrode and the data line has an undercut structure with the third PR patterns; etching the ohmic contact pattern using the third PR pattern as an etching mask to form an ohmic contact layer; completely removing the third PR pattern; forming a passivation layer on the source electrode, the drain electrode and the data line, the passivation layer including a drain contact hole exposing the drain electrode; and forming a pixel electrode on the passivation layer, the pixel electrode contacting the drain electrode through the drain contact hole.

In another aspect of the present invention, an array substrate for a liquid crystal display device includes a gate line on a substrate; a gate insulating layer on the gate line; a data line over the gate electrode and crossing the gate line; a thin film transistor connected to the gate line and the data line and including a gate electrode under the gate line, an active layer on the gate electrode, an ohmic contact layer on the active layer and source and drain electrodes on the ohmic contact layer, wherein the gate electrode is connected to the gate line, and wherein the source electrode is connected to the data line and spaced apart from the drain electrode; a first pattern including a same material as the active layer and provided on the gate insulating layer; a second pattern including a same material as the ohmic contact layer and provided on the first pattern under the data line; a passivation layer on the thin film transistor and including a drain contact hole exposing the drain electrode; and a pixel electrode on the passivation layer and contacting the drain electrode through the drain contact hole, wherein the second pattern has a width smaller than the first pattern and greater than the data line, and wherein the first pattern, the second pattern and the data line together have a stepped shape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings FIGS. 4A to 4J are cross-sectional views showing a fabricating process of an array substrate according to the present invention. A region where a thin film transistor (TFT) is formed is defined as a switching region TrA in a pixel region P.

Figure 4A:
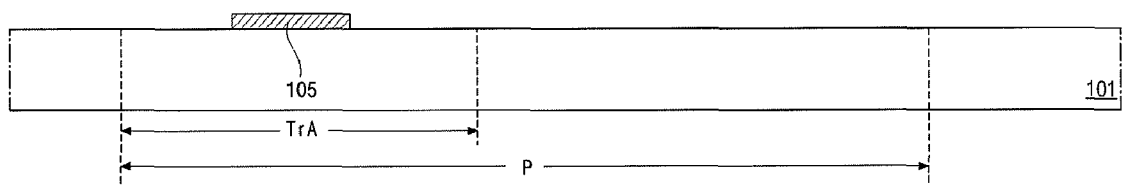
FIGS. 4A to 4J are cross-sectional views showing a fabricating process of an array substrate according to the present invention.

In FIG. 4A, a first metallic material layer is formed on the substrate 101. The first metallic material layer is patterned by a first mask process to form the gate line and the gate electrode 105. The gate electrode 105 is disposed in the switching region TrA. Although not shown, the first mask process includes a step of forming a photoresist (PR) layer, a step of exposing the PR layer to light using a first mask, a step of developing the exposed PR layer to form a PR pattern, a step of etching the first metallic material layer using the PR pattern as an etching mask to form the gate line and the gate electrode 105 and a step of stripping the PR pattern. The first metallic material layer may have a multiple-layered structure. In this case, each of the gate line and the gate electrode 105 has a multiple-layered structure.

Figure 4B:
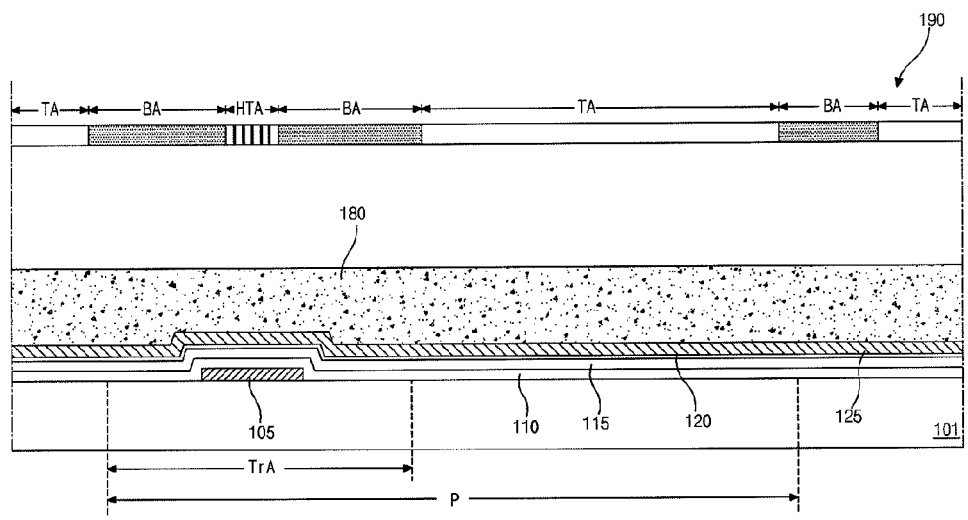

In FIG. 4B, an inorganic insulating material, such as silicon oxide ($SiO_2$) and silicon nitride (SiNx), is deposited on the substrate 101, where the gate line and the gate electrode 105 are formed, to form a gate insulating layer 110. An intrinsic amorphous silicon layer 115, an impurity-doped amorphous silicon layer 120 and a second metallic material layer 125 are sequentially formed on the gate insulating layer 110. The intrinsic amorphous silicon layer 115 includes intrinsic amorphous silicon, and the impurity-doped amorphous silicon layer 120 includes impurity-doped amorphous silicon. The second metallic material layer 125 preferably includes one of copper (Cu), Cu alloy, aluminum (Al) and Al alloy. Next, a PR layer 180 is formed on the second metallic material layer 125. If a portion of the PR layer 180 exposed by light is removed, then this type of PR layer may be called to as a positive type.

On the other hand, a negative type PR layer having an opposite property may be used. In this case, positions of a transmitting area and a blocking area in a mask are switched to obtain the same results.

Next, a second mask 190 having a transmitting area TA, a blocking area BA and a half-transmitting area HTA is disposed over the PR layer 180. The transmitting area TA has a relatively high transmittance so that light through the transmitting area TA can completely change the PR layer 180 chemically. The blocking area BA shields off light completely. The half-transmitting area HTA has a slit structure or a half-transmitting film that lowers intensity or transmittance of light through the half-transmitting area HTA. As a result, a transmittance of the half-transmitting area HTA is lower than that of the transmitting area TA and is higher than that of the blocking area BA. The half-transmitting area HTA and the blocking areas BA located adjacent to both sides of the half-transmitting area HTA correspond to the switching region TrA. Namely, the half-transmitting area HTA corresponds to a center of the gate electrode 105. The blocking area BA corresponds to a portion where a source electrode and a drain electrode are to be formed, as described later. In addition, the blocking area BA corresponds to a portion where a data line is to be formed, as described later. The transmitting area TA corresponds to other portions. The PR layer 180 is exposed to light through the second mask 190 to selectively remove the PR layer 180 depending on the structure of the second mask 190.

Figure 4C:
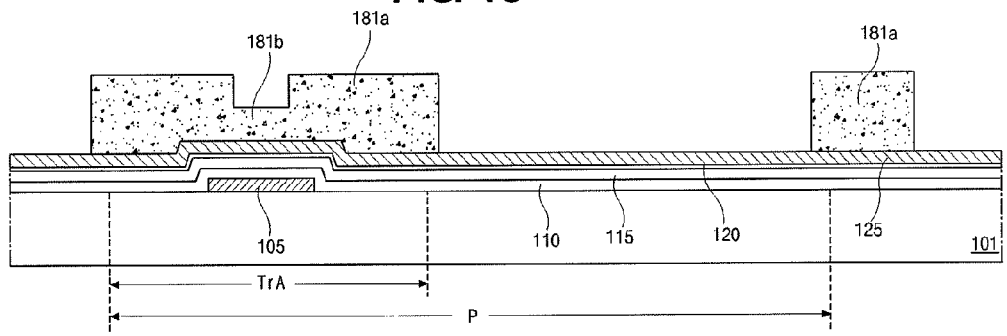

In FIG. 4C, the PR layer 180 (of FIG. 4B) is developed to form first and second PR patterns 181a and 181b on the second metallic material layer 125. The first PR pattern 181a has a first thickness and corresponds to the source electrode, the drain electrode and the data line. The second PR pattern 181b has a second thickness smaller than the first thickness and corresponds to the center of the gate electrode 105. Namely, the second PR pattern 181b corresponds to a space between the source and drain electrodes. The PR layer 180 (of FIG. 4B) in other portions that correspond with the transmitting areas TAs is completely removed such that the second metallic material layer 125 is exposed.

Figure 4D:
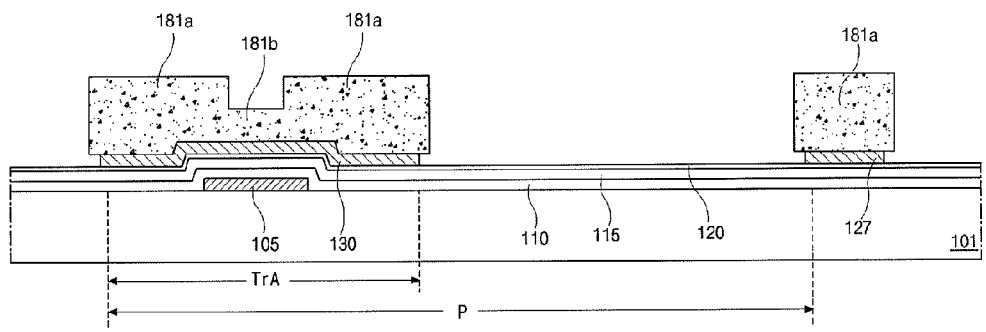

In FIG. 4D, the exposed second metal material layer 125 (of FIG. 4C) through the first and second PR patterns 181a and 181b is wet-etched with an etchant using the first and second PR patterns 181a and 181b as an etching mask to form a data line 127 and a metallic material pattern 130. The metallic material pattern 130 is disposed in the switching region TrA and connected to the data line 127. The impurity-doped amorphous silicon layer 120 is exposed between the data line 127 and the metallic material pattern 130. When the second metallic material layer 125 (of FIG. 4C) includes Cu or Cu alloy, the second metallic material layer 125 (of FIG. 4C) has a relatively high etching rate for the etchant. Accordingly, the data line 127 and the metallic material pattern 130 have an undercut structure with the first PR pattern 181a. Namely, the data line 127 has a width smaller than the first PR pattern 181a on the data line 127, and a width of the metallic material pattern 130 is smaller than that of the first and second PR patterns 181a and 181b in the switching region TrA.

Figure 4E:
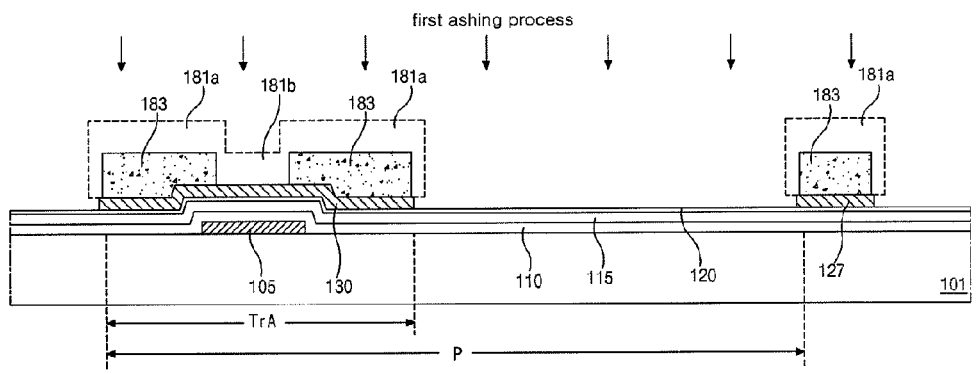

In FIG. 4E, a first ashing process is performed onto the substrate 101 including the first and second PR patterns 181a and 181b, the data line 127 and the metallic material pattern 130 are formed. The first ashing process has an isotropic property. By the first ashing process, not only the second PR pattern 181b is removed but also a width of the first PR pattern 181a is reduced.

The second PR pattern 181b is removed by the first ashing process such that a portion of the metallic material pattern 130 is exposed. At the same time, a width and a thickness of the first PR pattern 181a are reduced such that a third PR pattern 183 is formed on the metallic material pattern 130 and the data line 127. Since the third PR pattern 183 has a width smaller than the first PR pattern 181a, both ends of the metallic material pattern 130 are exposed. Also, both ends of the data line 127 are exposed. Namely, the data line 127 has a width greater than the first PR pattern 183 after the first ashing process.

Figure 3A:
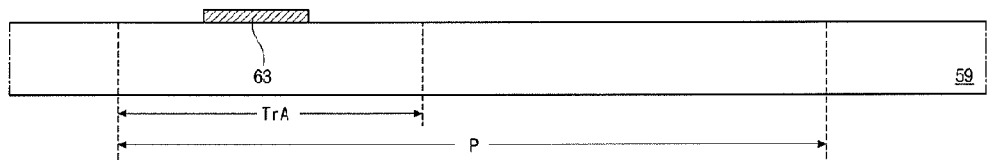
FIGS. 3A to 3H are cross-sectional views showing a four mask process for fabricating an array substrate according to the related art.
Figure 3B:
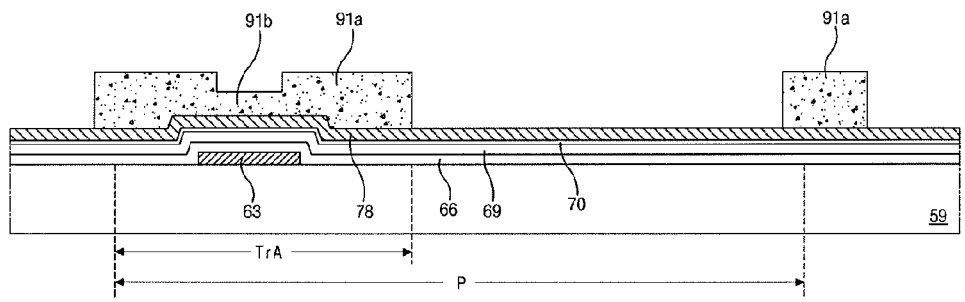
Figure 3C:
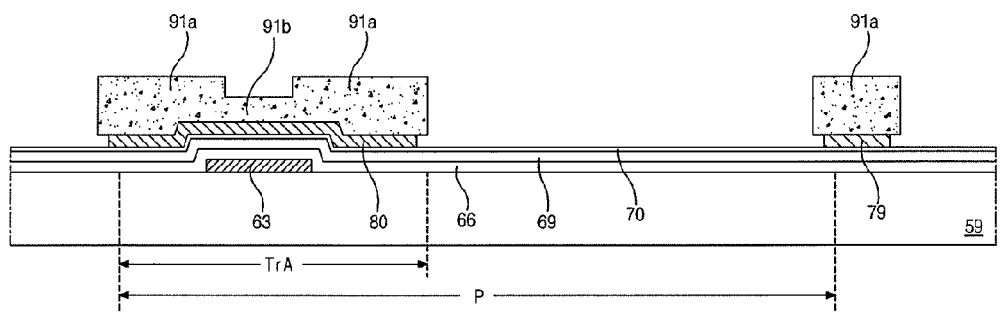
Figure 3D:
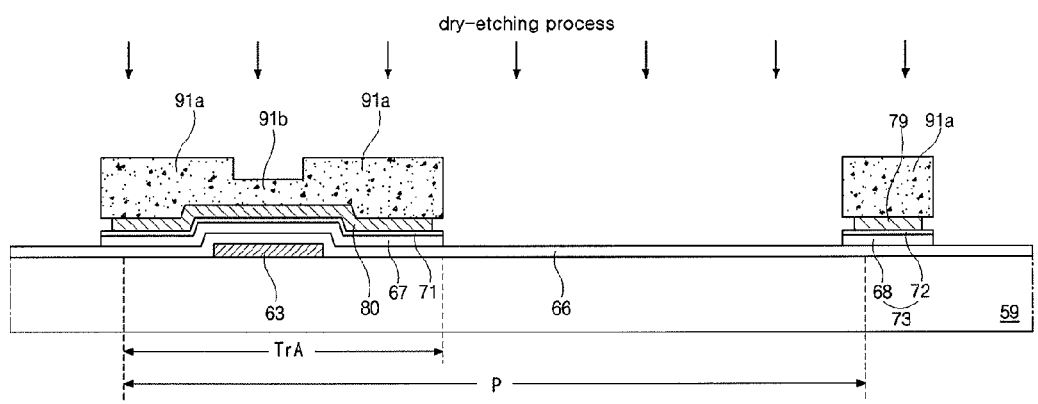
Figure 3E:
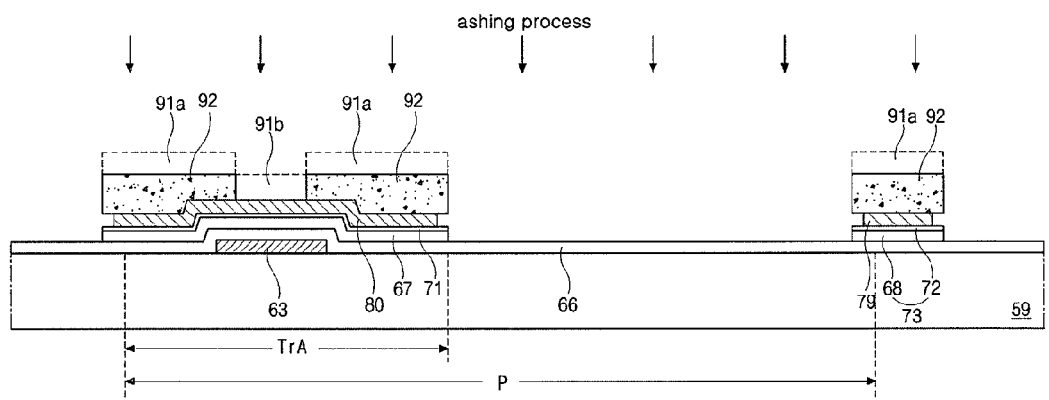

In the present invention, the first ashing process can has a shorter processing time than the related art ashing process, as shown in FIG. 3E. It is possible to increase a power supplied to an ashing process chamber to shorten the processing time. In the related art ashing process, the gate insulating layer 66 (of FIG. 3E) is exposed during the ashing process to remove the second PR pattern 91b (of FIG. 3E). A material, such as silicon oxide and silicon nitride, for the gate insulating layer has a weak property on a static electricity. Accordingly, if the ashing process is performed with an increased power, the gate insulating layer may be damaged such that an insulating property of the gate insulating layer may adversely affected. As a result of the damaged gate insulating layer, there can be problems of shorting between the gate line and the data line, and between the gate electrode and the metallic material pattern. Since the power for the ashing process is controlled not to generate the above problem, a processing time is increased.

However, in the present invention, the gate insulating layer 110 is covered with the impurity-doped amorphous silicon layer 120 during the first ashing process. Since the impurity-doped amorphous silicon layer 120 has a higher conductivity than the gate insulating layer 110, there is no damage on the impurity-doped amorphous silicon layer 120 if the first ashing process is performed with an increasing power. Accordingly, the first ashing process is performed with a high power such that a processing time is decreased.

Figure 4F:
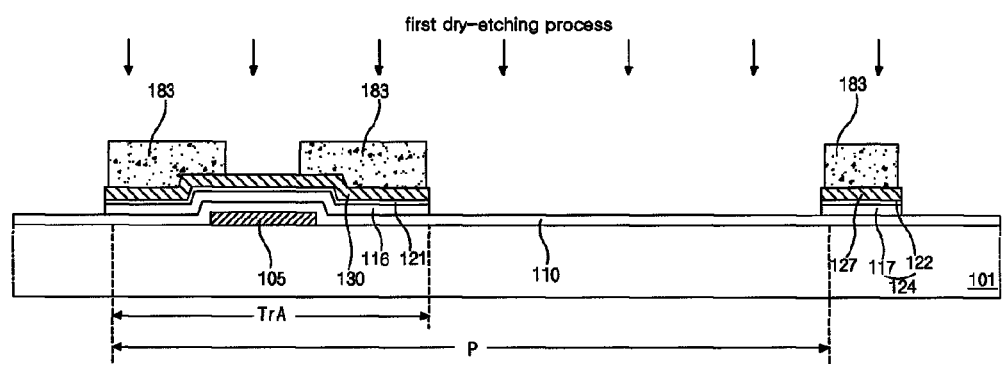

In FIG. 4F, the exposed portion of the impurity-doped amorphous silicon layer 120 (of FIG. 4E) between the data line 127 and the metallic material pattern 130 and the portion of the intrinsic amorphous silicon layer 115 (of FIG. 4E) under the exposed impurity-doped amorphous silicon layer 120 (of FIG. 4E) are removed by a first dry-etching process using the metallic material pattern 130 and the data line 127 as an etching mask to form an ohmic contact pattern 121 from the impurity-doped amorphous silicon layer 120 (of FIG. 4E) and an active layer 116 from the intrinsic amorphous silicon layer 115 (of FIG. 4E). Each of the ohmic contact pattern 121 and the active layer 116 has the same area and shape as the metallic material pattern 130 and completely overlaps the metallic material pattern 130. Namely, each of the ohmic contact pattern 121 and the active layer 116 has identical end lines with the metallic material pattern 130 at this stage.

Also, a semiconductor pattern 124 having a first pattern 122 from the impurity-doped amorphous silicon layer 120 (of FIG. 4E) and a second pattern 117 from the intrinsic amorphous silicon layer 115 (of FIG. 4E) is formed under the data line 127. The semiconductor pattern 127 has the same area and shape as the data line 127 and completely overlaps the data line 127. Namely, the semiconductor pattern 127 has identical end lines with the data line 127 at this stage.

Figure 4G:
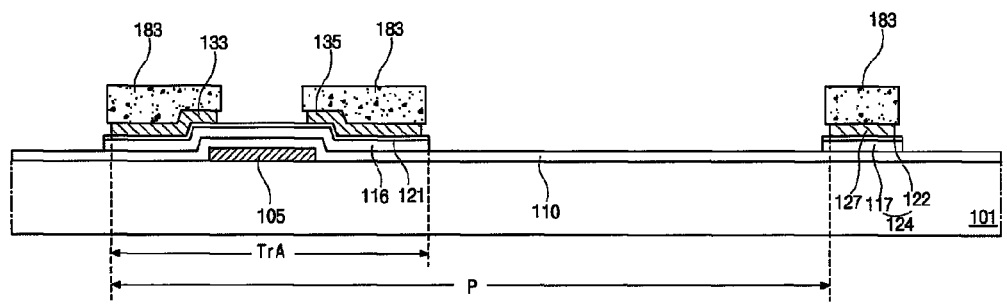

In FIG. 4G, the exposed portion of the metallic material pattern 130 (of FIG. 4F) between the third PR pattern 183 is patterned by a wet-etching process to form source and drain electrodes 133 and 135. The source electrode 133 is connected to the data line 127 and spaced apart from the drain electrode 135. When the data line 127 and the metallic material pattern 130 (of FIG. 4F) include Cu or Cu alloy, the data line 127 and the metallic material pattern 130 (of FIG. 4F) has a relatively high etching rate for the etchant. Accordingly, each of the data line 127, the source electrode 133 and the drain electrode has an undercut structure with the third PR pattern 183.

On the other hand, referring again to FIG. 4F, there may be damage on the metallic material pattern 130 by the first dry-etching process. In this case, an undesired patterning may be generated in the metallic material pattern 130 (of FIG. 4F) by the wet-etching process in FIG. 4G. Accordingly, although not shown, a width of the third PR pattern 183 is reduced by the second ashing process having an isotropic property after the first dry-etching process such that an exposed width of the metallic material pattern 130 (of FIG. 4F) is increased to prevent forming an undesired pattering in the metallic material pattern 130 (of FIG. 4F) by the wet-etching process in FIG. 4G. The second ashing process may be omitted.

Figure 4H:
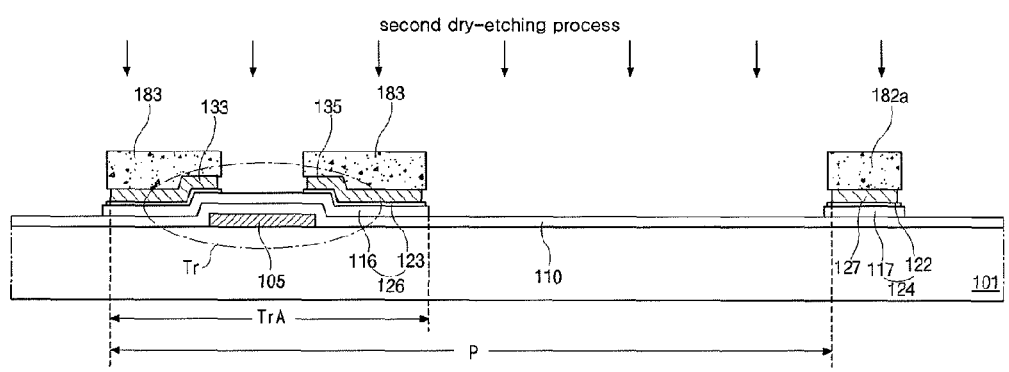

In FIG. 4H, an exposed portion of the ohmic contact pattern 121 (of FIG. 4G) through a space between the source and drain electrodes 133 and 135 is removed by a second dry-etching process to form an ohmic contact layer 123 and expose a portion of the active layer 116. Since the second dry-etching process is performed using the third PR pattern 183 as an etching mask, a portion of the ohmic contact pattern 121 (of FIG. 4G) protruding beyond the third PR pattern 183 and a portion of the first pattern 122 (of FIG. 4G) of the semiconductor pattern 124 protruding beyond the third PR pattern 183 are also removed. The gate electrode 105, the gate insulating layer 110, the semiconductor layer 126, which includes the active layer 123 and the ohmic contact layer 116, the source electrode 133 and the drain electrode 135 constitute a thin film transistor (TFT) Tr in the switching region TrA.

In the present invention, the second pattern 117, the first pattern 122 and the data line 127 are stacked on the gate insulating layer 110. The first pattern 122 has a width smaller than the second pattern 117 and greater than the data line 127. Hence, the second pattern 117, the first pattern 122 and the data line 127 have a step-like profile, as shown in FIG. 4H. In other words, the second pattern 117, the first pattern 122 and the data line 127 together form a stepped shape. The second pattern 117 of intrinsic amorphous silicon under the data line 127 has a protruding width beyond the data line 127 with a range of about 1.5 micrometers to about 1.8 micrometers. Since the second pattern 117, the first pattern 122 and the data line 127 have a step-like profile, the first pattern 122 of impurity-doped amorphous silicon has a protruding width beyond the data line 127 smaller than the protruding width of the second pattern 117. The protruding width of the second pattern 117 beyond the data line 127 in an embodiment of the present invention is smaller than the protruding width of the second pattern 72 beyond the data line 79 of the related art by about 2 micrometers.

To be similar, the active layer 116, the ohmic contact layer 123, the source electrode 133 and the drain electrode 135 having a step-like profile are formed in the switching region TrA. In more detail, the source electrode 133 and one portion of the ohmic contact layer 123 has a step-like profile or a stepped shape on the active layer 116, and the drain electrode 135 and the other portion of the ohmic contact layer 123 has a step-like profile or a stepped shape on the active layer 116. The active layer 116 has a protruding width beyond the source and drain electrodes 133 and 135 with a range of about 1.5 micrometers to about 1.8 micrometers. Moreover, since the ohmic contact layer 123, the source electrode 133 and the drain electrode 135 have a step-like profile or a stepped shape, the ohmic contact layer 123 has a protruding width beyond the source and drain electrodes 133 and 135 smaller than the protruding width of the active layer 116.

On the other hand, although not shown, a third ashing process having an isotropic property may be performed onto the substrate including the source and drain electrodes directly before the second dry-etching process to reduce a width of the third PR pattern. As a result, end portions of the data line, the source and drain electrodes are exposed through the third PR pattern. Then, an exposed portion of the ohmic contact pattern through a space between the source and drain electrodes and a protruding portion of the ohmic contact pattern beyond the source and drain electrodes are removed by a second dry-etching process to form an ohmic contact layer and expose a portion of the active layer. As a result, the ohmic contact layer has the same area and shape as the source and drain electrodes. The ohmic contact layer completely overlaps the source and the drain electrodes. Accordingly, only the active layer has a protruding width beyond the source and drain electrodes with a range of about 1.5 micrometers to about 1.8 micrometers. At the same time, a protruding portion of the first pattern of the semiconductor pattern beyond the data line is removed by the second dry-etching. As a result, the first pattern of the semiconductor pattern under the data line has the same area and shape as the data line. The first pattern of the semiconductor pattern perfectly overlaps the data line. Accordingly, only the second pattern of intrinsic amorphous silicon under the data line has a protruding width beyond the data line with a range of about 1.5 micrometers to about 1.8 micrometers.

Figure 4I:
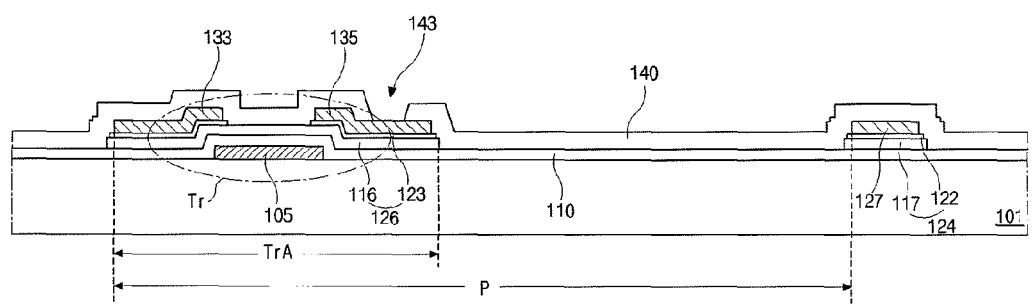

Next, in FIG. 4I, the third PR pattern 183 (of FIG. 4H) is removed by applying a stripping process onto the substrate 101 including the source electrode 133, the drain electrode 135 and the ohmic contact layer 123 under the source and drain electrodes 133 and 135. Then, a passivation layer 140 is formed on the source electrode 133, the drain electrode 135 and the data line 127 by depositing an inorganic insulating material, such as silicon oxide ($SiO_2$) and silicon nitride (SiNx). The passivation layer 140 is patterned by a mask process to form a drain contact hole 143 exposing a portion of the drain electrode 135.

Figure 4J:
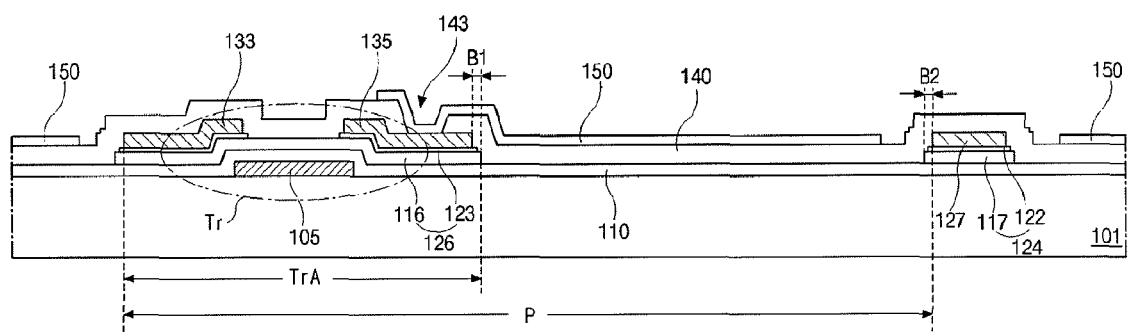

Next, in FIG. 4J, a transparent conductive material layer is formed on the passivation layer 140 by depositing a transparent conductive material such as indium-tin-oxide (ITO) and indium-zinc-oxide (IZO). The transparent conductive material layer is patterned by a mask process to form a pixel electrode 150 in each pixel region P. The pixel electrode 150 contacts the drain electrode 135 through the drain contact hole 143. The pixel electrode 150 may overlap the previous gate line to form a storage capacitor.

Figure 1:
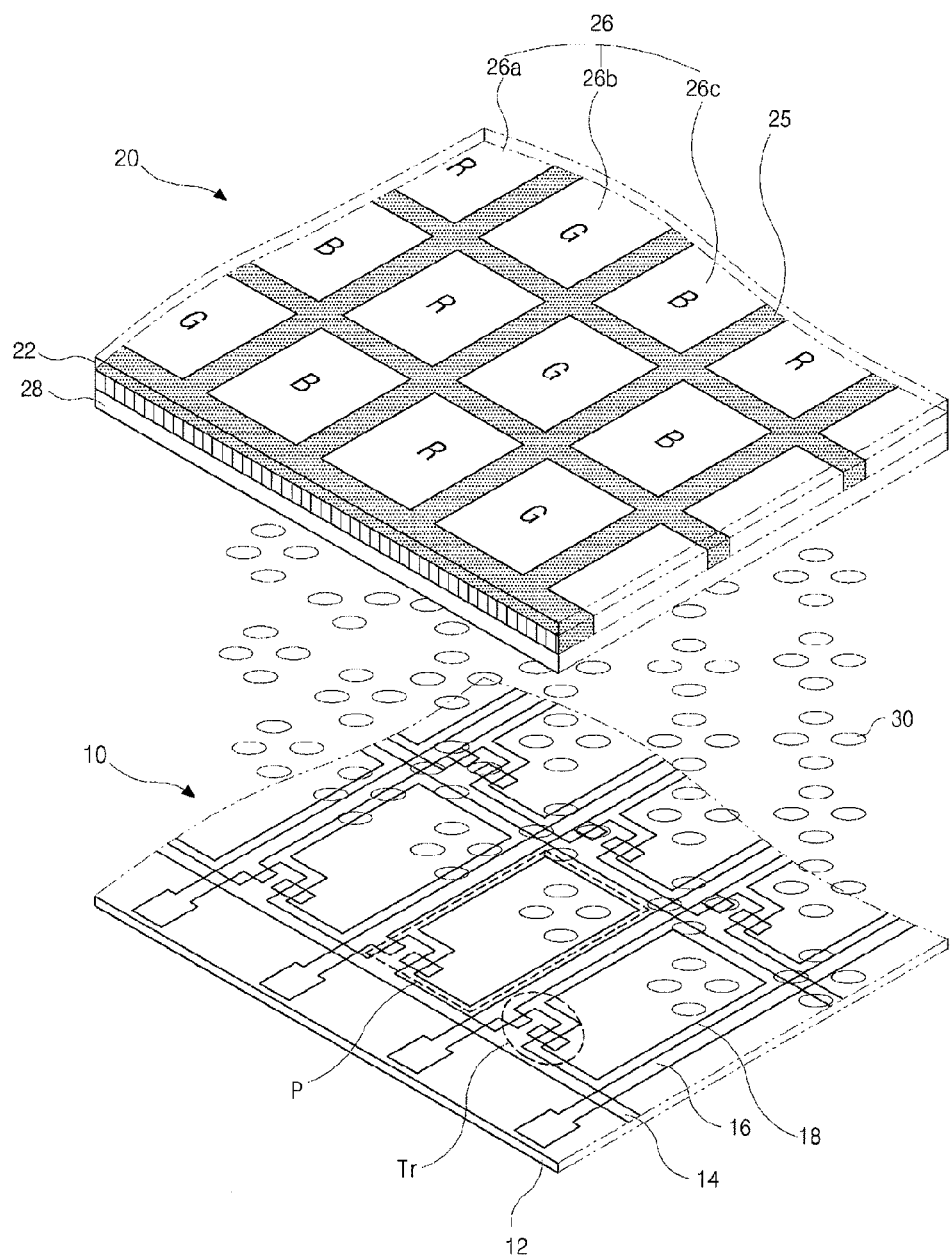
FIG. 1 is an exploded perspective view of a related art LCD device.
Figure 2:
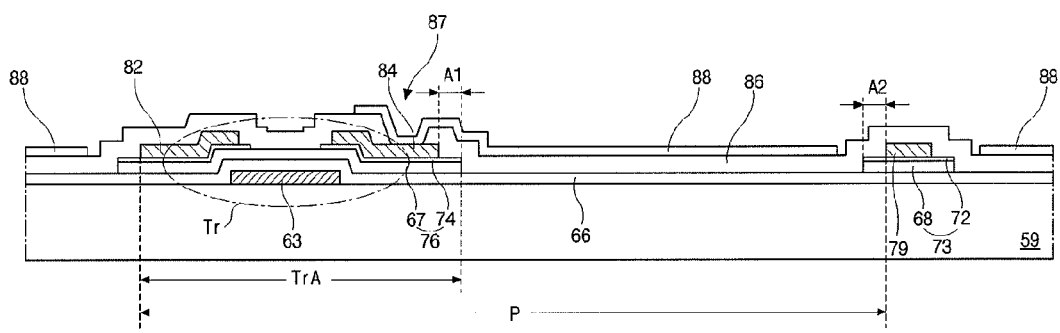
FIG. 2 is a cross-sectional view of one pixel region of an array substrate for a related art LCD device.

With compared to the related art array substrate 59 (of FIG. 2), the semiconductor layer 126 in the array substrate 101 of the present invention has a decreased protruding width B1 beyond the source and drain electrodes 133 and 135. Moreover, the semiconductor pattern 124 has a decreased protruding width B2 beyond the data line 127.

Referring again to FIG. 2 showing the related art array substrate, both the active layer 67 and the ohmic contact layer 74 protrude beyond the source and drain electrodes 82 and 84 with a width "A1" of about 2 micrometers to 2.5 micrometers. Both the second pattern 68 of intrinsic amorphous silicon and the first pattern 72 of impurity-doped amorphous silicon also protrude beyond the data line 79 with a width "A2" of about 2 micrometers to 2.5 micrometers. On the other hand, referring again to FIG. 4J showing the array substrate of the present invention, the active layer 116 protrudes beyond the source and drain electrodes 133 and 135 with a width "B1" of about 1.5 micrometers to 1.8 micrometers. The second pattern 117 of intrinsic amorphous silicon protrudes beyond the data line 127 with a width "B2" of about 1.5 micrometers to 1.8 micrometers. Namely, the active layer 116 and the second pattern 117 in the array substrate of the present invention have exposed portions from the source and drain electrodes 133 and 135 and the data line 127, respectively, less than those in the related art array substrate. Accordingly, a distance of the data line 127 and the pixel electrode 150 can be reduced such that an aperture ratio is improved.

Figure 3F:
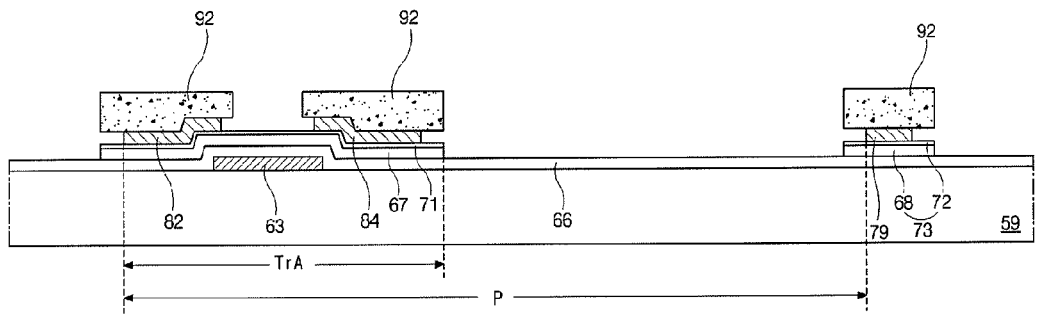
Figure 3G:
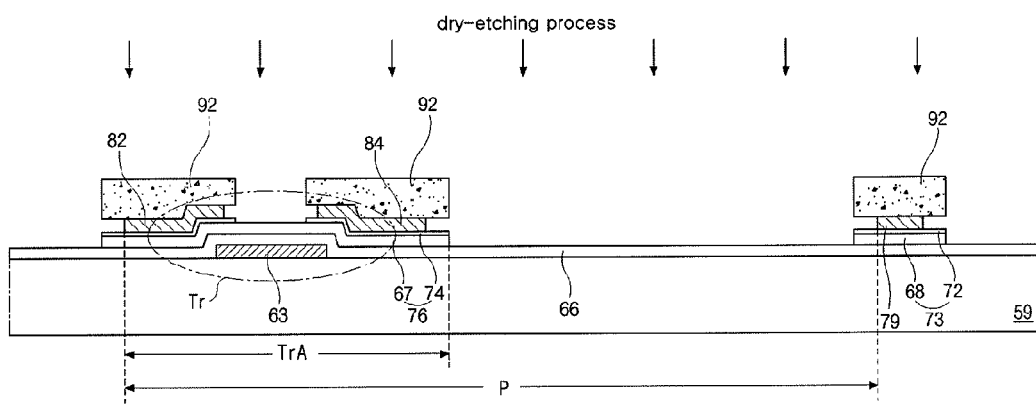
Figure 3H:
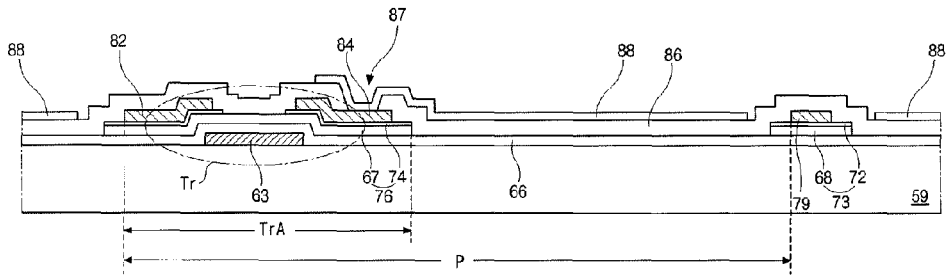

The disadvantages of the related art resulted from a dry-etching process and an ashing process in a fabricating process of the source and drain electrodes. Referring again to FIGS. 3C and 3F showing a fabricating process of the related art array substrate, the dry-etching process is performed to form the active layer 67 and the second pattern 68 directly after the wet-etching process onto the second metallic material layer 78 of Cu or Cu alloy to form the data line 79 and the metallic material pattern 80. Each of the active layer 67 and the second pattern 68 has an unchanged width in following processes. However, the data line 79 and the metallic material pattern 80 is etched by a wet-etching process in FIG. 3F. Accordingly, a protruding portion of the active layer 67 and the second pattern 68 is increased.

On the other hand, referring to FIG. 4E showing a fabricating process of the array substrate of the present invention, the first ashing process is performed to remove the second PR pattern 181b and form the third PR pattern 183 after the wet-etching process to form the data line 127 and the metallic material pattern 130 and before the first dry-etching process to form the active layer 116, the ohmic contact pattern 121, the first pattern 122 and the second pattern 117. By the first ashing process, not only the thickness of the first PR pattern 181a but also the width of the first PR pattern 181a is reduced such that the third PR pattern 183 has a less thickness and a less width than the first PR pattern 181a. Accordingly, after the first dry-etching process is performed onto the substrate 101, as shown in FIG. 4F, the active layer 116 does not protrude beyond the metallic material pattern 130. Moreover, the second pattern 117 of the semiconductor pattern 124 does not protrude beyond the data line 127. Accordingly, as shown in FIG. 4J, each of a protruding width of the active layer 116 B1 beyond the source and drain electrodes 133 and 135 and a protruding width of the second pattern 117 beyond the data line 127 is minimized.

In the array substrate of the present invention, since a protruding width of the semiconductor pattern under the data line is minimized, the distance between the data line 127 and the pixel electrode 150 can be reduced. As a result, the LCD device including the array substrate according to this embodiment of the present invention has improved aperture ratio and brightness.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a data line on an array substrate for a liquid crystal display device, the method comprising:
   forming on a substrate a gate insulating layer, an intrinsic amorphous silicon layer, an impurity-doped amorphous silicon layer, and a metallic material layer;
   forming an initial photoresist (PR) pattern on the metallic material layer;
   etching the metallic material layer using the initial PR pattern as an etching mask to form the data line and a metallic material pattern, wherein the initial PR pattern is disposed on the data line;
   performing a first ashing process onto the initial PR pattern to partially remove the initial PR pattern so as to form a first ashed PR pattern, the first ashed PR pattern having a smaller width and a smaller thickness than the initial PR pattern such that end portions of the data line are exposed by the first ashed PR pattern, wherein the impurity-doped amorphous silicon layer is exposed between the data line and the metallic material pattern after performing the first ashing process, wherein the first ashed PR pattern on the data line has a smaller width than the data line;
   etching the intrinsic amorphous silicon layer and the impurity-doped amorphous silicon layer by a first dry-etching process using the data line as an etching mask to form first and second patterns under the data line;
   etching a portion of the metallic material pattern to form a source electrode and a drain electrode on the substrate;
   removing the first ashed PR pattern;
   forming a passivation layer on the source electrode, the drain electrode and the data line; and
   forming a pixel electrode on the passivation layer.

2. The method according to claim 1, wherein the metallic material layer includes one of copper and copper alloy.

3. The method according to claim 1, wherein the impurity-doped amorphous silicon layer and the intrinsic amorphous silicon layer are stacked on the gate insulating layer during the first ashing process.

4. The method according to claim 1, wherein the step of forming the pixel electrode includes:
   depositing one of indium-tin-oxide and indium-zinc-oxide to form a transparent conductive material layer on the passivation layer; and
   patterning the transparent conductive material layer to form the pixel electrode.

5. The method according to claim 1, wherein at least one of the step of forming the gate insulating layer and forming the passivation layer includes depositing one of silicon nitride and silicon oxide.

6. A method of fabricating a data line on an array substrate for a liquid crystal display device, the method comprising:
   forming on a substrate a gate insulating layer, an intrinsic amorphous silicon layer, an impurity-doped amorphous silicon layer, and a metallic material layer;
   forming an initial photoresist (PR) pattern on the metallic material layer;
   etching the metallic material layer using the initial PR pattern as an etching mask to form the data line and a metallic material pattern, wherein the initial PR pattern is disposed on the data line;
   performing a first ashing process onto the initial PR pattern to partially remove the initial PR pattern so as to form a first ashed PR pattern, the first ashed PR pattern having a smaller width and a smaller thickness than the initial PR pattern such that end portions of the data line are exposed by the first ashed PR pattern;
   etching the intrinsic amorphous silicon layer and the impurity-doped amorphous silicon layer by a first dry-etching process using the data line as an etching mask to form first and second patterns under the data line;
   etching a portion of the metallic material pattern to form a source electrode and a drain electrode on the substrate;
   removing the first ashed PR pattern;

forming a passivation layer on the source electrode, the drain electrode and the data line;

forming a pixel electrode on the passivation layer; and performing a second ashing process directly after the step of etching the intrinsic amorphous silicon layer and the impurity-doped amorphous silicon layer to partially remove the first ashed PR pattern so as to form a second ashed PR pattern, the second ashed PR pattern having a smaller width than the first ashed PR pattern.

7. The method according to claim 6, further comprising forming a third ashing process directly before the step of etching to form a source electrode and a drain electrode, to partially remove the second ashed PR pattern so as to form a third ashed PR pattern, the third ashed PR pattern having a smaller width than the second ashed PR patterns.

8. A method of fabricating an array substrate for a liquid crystal display device, the method comprising:

forming a gate line and a gate electrode on a substrate, the gate electrode connected to the gate line; sequentially forming a gate insulating layer, an intrinsic amorphous silicon layer, an impurity-doped amorphous silicon layer, and a metallic material layer on the gate line and the gate electrode; forming first photoresist (PR) patterns and a second PR pattern having a thickness smaller than each of the first PR patterns on the metallic material layer;

etching the metallic material layer using the first and second PR patterns as an etching mask to form a data line and a metallic material pattern, and the metallic material pattern corresponding to the gate electrode, wherein the second PR pattern and two of the first PR patterns provided adjacent to both sides of the second PR pattern are disposed on the metallic material pattern, and one of the first PR patterns is disposed on the data line, and wherein each of the metallic material pattern and the data line has an undercut structure with the first PR patterns;

performing a first ashing process onto the first and second PR patterns to partially remove the first PR patterns and to remove the second PR pattern, so as to form third PR patterns, each of the third PR patterns having a smaller width and a smaller thickness than each of the first PR patterns such that end portions of the data line and the metallic material patterns and a center portion of the metallic material pattern are exposed by the third PR patterns, wherein the impurity-doped amorphous silicon layer is exposed between the data line and the metallic material pattern after performing the first ashing process, wherein each third PT pattern on the data line has a smaller width than the data line;

etching the intrinsic amorphous silicon layer and the impurity-doped amorphous silicon layer by a first dry-etching process using the metallic material pattern and the data line as an etching mask to form an ohmic contact pattern and an active layer under metallic material pattern, and first and second patterns under the data line, wherein each of the ohmic contact pattern and the active layer has a same area and shape as the metallic material pattern and overlaps the metallic material pattern, and each of the first and second patterns has a same area and shape as the data line and overlaps the data line;

etching the center of the metallic material pattern exposed by the third PR patterns to form a source electrode and a drain electrode spaced apart from the source electrode, wherein each of the source electrode, the drain electrode and the data line has an undercut structure with the third PR patterns;

etching the ohmic contact pattern using the third PR patterns as an etching mask to form an ohmic contact layer;

removing the third PR patterns;

forming a passivation layer on the source electrode, the drain electrode and the data line, the passivation layer including a drain contact hole exposing the drain electrode; and forming a pixel electrode on the passivation layer.

9. The method according to claim 8, wherein the metallic material layer includes one of copper and copper alloy.

10. The method according to claim 8, wherein the first ashing process has an isotropic property.

11. The method according to claim 8, wherein the step of forming the first PR patterns and the second PR pattern includes:

forming a PR layer on the metallic material layer;

disposing a mask having a transmitting area, a blocking area and a half-transmitting area over the PR layer; and exposing and developing the PR layer through the mask to form the first PR patterns and the second PR pattern, wherein each of the first PR patterns correspond to one of the transmitting area and the blocking area, and the second PR pattern corresponding to the half-transmitting area, wherein a transmittance of the transmitting area is higher than a transmittance of a half-transmitting area, and the blocking area has no transmittance.

12. The method according to claim 8, wherein the impurity-doped amorphous silicon layer and the intrinsic amorphous silicon layer are stacked on the gate insulating layer during the first ashing process.

13. The method according to claim 8, wherein the step of forming the pixel electrode includes:

depositing one of indium-tin-oxide and indium-zinc-oxide to form a transparent conductive material layer on the passivation layer; and patterning the transparent conductive material layer to form the pixel electrode.

14. The method according to claim 8, wherein at least one of the step of forming the gate insulating layer and forming the passivation layer includes depositing one of silicon nitride and silicon oxide.

15. The method according to claim 8, wherein the source electrode and one portion of the ohmic contact layer together form a stepped shape on the active layer, and the drain electrode and the other portion of the ohmic contact layer together form a stepped shape on the active layer.

16. A method of fabricating an array substrate for a liquid crystal display device, the method comprising:

forming a gate line and a gate electrode on a substrate, the gate electrode connected to the gate line;

sequentially forming a gate insulating layer, an intrinsic amorphous silicon layer, an impurity-doped amorphous silicon layer, and a metallic material layer on the gate line and the gate electrode;

forming first photoresist (PR) patterns and a second PR pattern having a thickness smaller than each of the first PR patterns on the metallic material layer;

etching the metallic material layer using the first and second PR patterns as an etching mask to form a data line and a metallic material pattern, and the metallic material pattern corresponding to the gate electrode, wherein the second PR pattern and two of the first PR patterns provided adjacent to both sides of the second PR pattern are disposed on the metallic material pattern, and one of the first PR patterns is disposed on the data line, and wherein each of the metallic material pattern and the data line has an undercut structure with the first PR patterns;

performing a first ashing process onto the first and second PR patterns to partially remove the first PR patterns and to remove the second PR pattern, so as to form third PR patterns, each of the third PR patterns having a smaller width and a smaller thickness than each of the first PR patterns such that end portions of the data line and the metallic material patterns and a center portion of the metallic material pattern are exposed by the third PR patterns;

etching the intrinsic amorphous silicon layer and the impurity-doped amorphous silicon layer by a first dry-etching process using the metallic material pattern and the data line as an etching mask to form an ohmic contact pattern and an active layer under metallic material pattern, and first and second patterns under the data line, wherein each of the ohmic contact pattern and the active layer has a same area and shape as the metallic material pattern and overlaps the metallic material pattern, and each of the first and second patterns has a same area and shape as the data line and overlaps the data line;

etching the center of the metallic material pattern exposed by the third PR patterns to form a source electrode and a drain electrode spaced apart from the source electrode, wherein each of the source electrode, the drain electrode and the data line has an undercut structure with the third PR patterns;

etching the ohmic contact pattern using the third PR patterns as an etching mask to form an ohmic contact layer;

removing the third PR patterns;

forming a passivation layer on the source electrode, the drain electrode and the data line, the passivation layer including a drain contact hole exposing the drain electrode;

forming a pixel electrode on the passivation layer; and performing a second ashing process directly after the step of etching the intrinsic amorphous silicon layer and the impurity-doped amorphous silicon layer to increase widths of the end portions of the data line and the metallic material pattern exposed by the third PR patterns.

17. A method of fabricating an array substrate for a liquid crystal display device, the method comprising:

forming a gate line and a gate electrode on a substrate, the gate electrode connected to the gate line; sequentially forming a gate insulating layer, an intrinsic amorphous silicon layer, an impurity-doped amorphous silicon layer, and a metallic material layer on the gate line and the gate electrode;

forming first photoresist patterns and a second PR pattern having a thickness smaller than each of the first PR patterns on the metallic material layer;

etching the metallic material layer using the first and second PR patterns as an etching mask to form a data line and a metallic material pattern, and the metallic material pattern corresponding to the gate electrode, wherein the second PR pattern and two of the first PR patterns provided adjacent to both sides of the second PR pattern are disposed on the metallic material pattern, and one of the first PR patterns is disposed on the data line, and wherein each of the metallic material pattern and the data line has an undercut structure with the first PR patterns;

performing a first ashing process onto the first and second PR patterns to partially remove the first PR patterns and to remove the second PR pattern, so as to form third PR patterns, each of the third PR patterns having a smaller width and a smaller thickness than each of the first PR patterns such that end portions of the data line and the metallic material patterns and a center portion of the metallic material pattern are exposed by the third PR patterns;

etching the intrinsic amorphous silicon layer and the impurity-doped amorphous silicon layer by a first dry-etching process using the metallic material pattern and the data line as an etching mask to form an ohmic contact pattern and an active layer under metallic material pattern, and first and second patterns under the data line, wherein each of the ohmic contact pattern and the active layer has a same area and shape as the metallic material pattern and overlaps the metallic material pattern, and each of the first and second patterns has a same area and shape as the data line and overlaps the data line;

etching the center of the metallic material pattern exposed by the third PR patterns to form a source electrode and a drain electrode spaced apart from the source electrode, wherein each of the source electrode, the drain electrode and the data line has an undercut structure with the third PR patterns;

etching the ohmic contact pattern using the third PR patterns as an etching mask to form an ohmic contact layer;

removing the third PR patterns;

forming a passivation layer on the source electrode, the drain electrode and the data line, the passivation layer including a drain contact hole exposing the drain electrode; forming a pixel electrode on the passivation layer; and forming a third ashing process directly before the step of etching the center of the metallic material pattern to reduce a width of the third PR patterns and expose end portions of the source electrode, the drain electrode and the data line by the third PR patterns.

18. A method of fabricating an array substrate for a liquid crystal display device, the method comprising:

forming a gate line and a gate electrode on a substrate, the gate electrode connected to the gate line;

sequentially forming a gate insulating layer, an intrinsic amorphous silicon layer, an impurity-doped amorphous silicon layer, and a metallic material layer on the gate line and the gate electrode;

forming first photoresist (PR) patterns and a second PR pattern having a thickness smaller than each of the first PR patterns on the metallic material layer;

etching the metallic material layer using the first and second PR patterns as an etching mask to form a data line and a metallic material pattern, and the metallic material pattern corresponding to the gate electrode, wherein the second PR pattern and two of the first PR patterns provided adjacent to both sides of the second PR pattern are disposed on the metallic material pattern, and one of the first PR patterns is disposed on the data line, and wherein each of the metallic material pattern and the data line has an undercut structure with the first PR patterns;

performing a first ashing process onto the first and second PR patterns to partially remove the first PR patterns and to remove the second PR pattern, so as to form third PR patterns, each of the third PR patterns having a smaller width and a smaller thickness than each of the first PR patterns such that end portions of the data line and the metallic material patterns and a center portion of the metallic material pattern are exposed by the third PR patterns;

etching the intrinsic amorphous silicon layer and the impurity-doped amorphous silicon layer by a first dry-etching process using the metallic material pattern and the data line as an etching mask to form an ohmic contact pattern and an active layer under metallic material pattern, and first and second patterns under the data line, wherein each of the ohmic contact pattern and the active layer has a same area and shape as the metallic material pattern and overlaps the metallic material pattern, and each of the first and second patterns has a same area and shape as the data line and overlaps the data line;

etching the center of the metallic material pattern exposed by the third PR patterns to form a source electrode and a drain electrode spaced apart from the source electrode, wherein each of the source electrode, the drain electrode and the data line has an undercut structure with the third PR patterns;

etching the ohmic contact pattern using the third PR patterns as an etching mask to form an ohmic contact layer;

removing the third PR patterns; forming a passivation layer on the source electrode, the drain electrode and the data line, the passivation layer including a drain contact hole exposing the drain electrode; and forming a pixel electrode on the passivation layer, wherein during the step of etching the ohmic contact pattern, the first pattern under the data line is etched using the third PR patterns as an etching mask such that the first pattern has a width smaller than the second pattern and greater than the data line, wherein the first pattern, the second pattern and the data line together form a stepped shape.

* * * * *